(12) United States Patent
Chow et al.

(10) Patent No.: US 6,608,517 B1
(45) Date of Patent: Aug. 19, 2003

(54) LIVE-INSERTION PMOS BIASING CIRCUIT FOR NMOS BUS SWITCH

(75) Inventors: Arnold Chow, Sunnyvale, CA (US); Kwong Shing Lin, Sunnyvale, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 46 days.

(21) Appl. No.: 10/064,945

(22) Filed: Aug. 30, 2002

(51) Int. Cl.[7] ............................................... H03K 17/00
(52) U.S. Cl. ........................ 327/365; 327/365; 327/534; 326/86; 326/87
(58) Field of Search ................................ 327/365, 534, 327/535, 537; 326/82, 83, 86, 87

(56) References Cited

U.S. PATENT DOCUMENTS 5,543,734 A * 8/1996 Volk et al. ..................... 326/83
6,320,408 B1 * 11/2001 Kwong ........................ 326/31

* cited by examiner

Primary Examiner—Timothy P. Callahan
Assistant Examiner—An T. Luu

(57) ABSTRACT

A bus switch has an n-channel bus-switch transistor between two buses and a p-channel pullup transistor. When power is disconnected from the bus switch, and one bus is hot and has a voltage above ground, this higher voltage is conducted to the gate and substrate of the p-channel pullup transistor. This biasing keeps the p-channel transistor turned off. When power is off, a connecting p-channel transistor connects the higher voltage on the hot bus to the p-channel gate node, while an inverting p-channel transistor connects the gate node to the substrate under the p-channel transistor. Inverting transistors receive an inverse enable signal and drive the gate node when power is applied, turning on the pullup transistor when the n-channel bus-switch transistor is off, and vice-versa. The gate node is fed back and applied to the gate of a source transistor that connects power to the substrate.

20 Claims, 3 Drawing Sheets

LIVE-INSERTION PMOS BIASING CIRCUIT FOR NMOS BUS SWITCH

BACKGROUND OF INVENTION

This invention relates to hot-plug isolation circuits, and more particularly to a pull-up biasing circuit when powered down.

High-speed computer and communication systems often employ networks. On a physical level, these networks have cables that connect together stations, and these cables are in turn connected together using relays or bus switches.

Bus switches are semiconductor integrated circuits (IC's) that use metal-oxide semiconductor (MOS) transistors to make or break the connection. Several switches may be combined on a single silicon die. One such device is made by the assignee and marketed as the PI5C3861 Bus Switch. More background on bus switches can be found in Parallel Micro-Relay Bus Switch for Computer Network Communication with Reduced Crosstalk and Low On-Resistance using Charge Pumps, U.S. Pat. No. 5,808,502, also "Bus Switch Having Both P- and N-Channel Transistors for Constant Impedance Using Isolation Circuit for Live-Insertion when Powered, U.S. Pat. No. 6,034,553.

FIG. 1 shows a prior-art bus switch device. N-channel transistor 10 conducts current from its drain to its source, connecting signal lines from two buses 20, 26 when an enable signal EN is applied to the gate of n-channel transistor 10. Bus switches are usually large in size to allow a large amount of current to flow, and to provide a low on resistance.

Pullup transistor 12 also has its gate connected to enable signal EN. However, since pullup transistor 12 is a p-channel device, it turns on when EN is low, when bus-switch n-channel transistor 10 is off. Pullup transistor 12 pulls hot bus 20 high to prevent a floating bus 20 or provides termination. A bias voltage other than the power-supply may be used with the pullup.

When power is off, enable signal EN is floating, and the gate of n-channel transistor 10 is also floating since a preceding inverter (not shown) that drives signal EN has no power. Since charge leaks off after a period of time, it is likely that the gate of n-channel transistor 10 is at ground when powered off. Thus n-channel transistor 10 does not conduct current from hot bus 20 to second bus 26 when powered off, regardless of the voltages on hot bus 20 and second bus 26.

However, p-channel pullup transistor 12 may conduct when power is off. FIG. 2 shows a prior-art bus switch with a pullup that conducts when power is off. When power is disconnected, EN is low turning off transistor 10. However, the low EN signal applied to the gate of p-channel pullup transistor 12 may allow it to conduct. When hot bus 20 is high, and power (Vdd or Vcc) is low, transistor 12 can conduct since its source, bus 20, is higher than its gate (EN, ground). Charge is conducted from hot bus 20 to the internal Vcc bus through pullup transistor 12. This may be undesirable.

Modern networking equipment is often reconfigured. Network boards or cards may be added to a backplane bus without powering down the bus and thus shutting down the network. This is known as hot insertion or live insertion.

Hot bus 20 can be a network bus such as a backplane bus in a chassis or equipment rack. Hot bus 20 is powered up and active, having signals in high and low states. These signals may be changing rapidly during the insertion sequence. Under these circumstances, when transistors 10, 12 are on the board being inserted, the voltage on hot bus 20 may be disturbed causing failures of other powered-up boards. Data on hot bus 20 can be lost since high data rates use only a few microseconds or nanoseconds for each data transfer.

NMOS bus switches are ideal for live-insertion applications, since n-channel transistors do not conduct when their gates are grounded. The drains of n-channel transistors can be directly connected to the hot bus since the p-type substrates are also grounded, preventing the forward-biasing of any p-n junctions. However, the use of a p-channel pullup transistor can cause problems during live insertion.

What is desired is to use a NMOS bus switch for hot-plug or live insertion applications. It is desired to use a NMOS bus switch with a PMOS pullup transistor for biasing the hot bus. It is desired to insert the bus switch with the p-channel pullup into a hot, live bus without disturbing the hot bus.

DETAILED DESCRIPTION

The present invention relates to an improvement in hot-insertion bus isolation. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

When power is off, the gate of the p-channel pullup transistor should be driven with the highest available voltage to shut off the p-channel transistor. Likewise, the bulk terminal or N-well under the p-channel pullup transistor should also be driven with the highest available voltage. The highest available voltage is not the internal power supply when the device is powered down; instead, the source or drain of the bus switch connected to the hot bus is likely to be the highest voltage.

N-well technology is often used for the bus switch rather than P-well technology. This allows the N-well under p-channel transistors to be isolated from other p-channel transistors on the chip. Rather than simply connect the N-well to the power supply, the N-well is driven by a substrate-isolation circuit.

Figure 1:
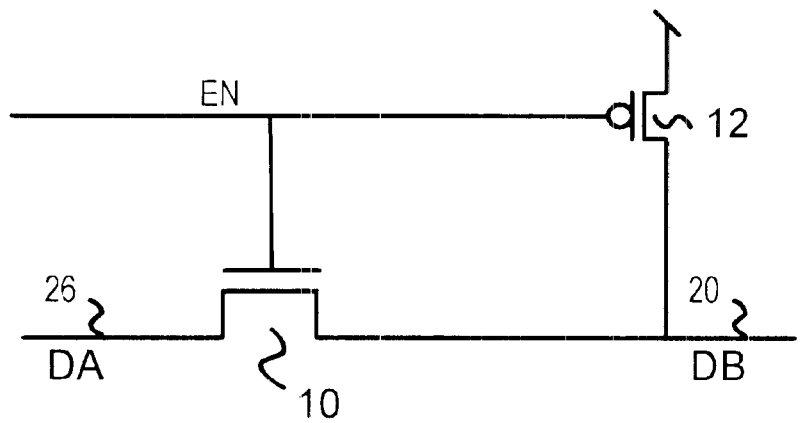
FIG. 1 shows a prior-art bus switch device.
Figure 2:
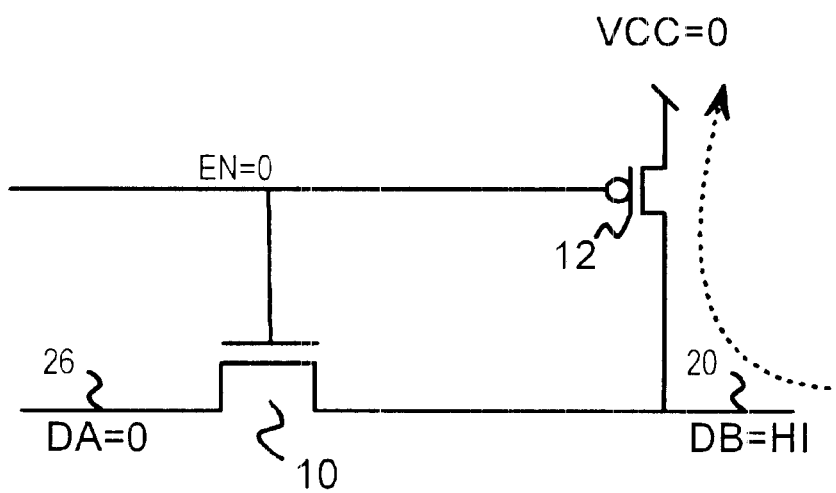
FIG. 2 shows a prior-art bus switch with a pullup that conducts when power is off.
Figure 3:
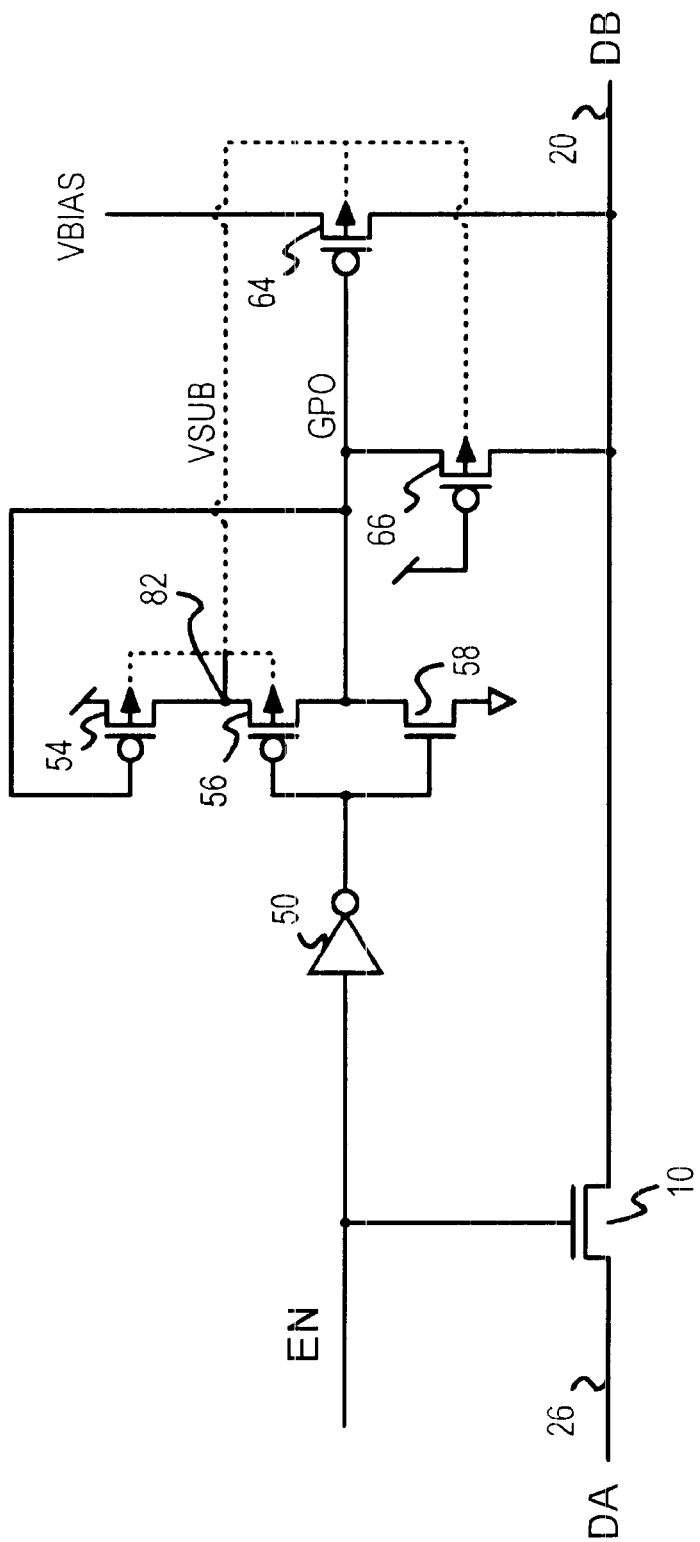
FIG. 3 is a diagram of an NMOS bus switch with a PMOS pullup having a gate and substrate isolation circuit.

FIG. 3 is a diagram of an NMOS bus switch with a PMOS pullup having a gate and substrate isolation circuit. The bus switch has n-channel transistor 10 between hot bus 20 and a second bus 26 that may or may not be powered up. Enable signal EN is applied to the gate of n-channel transistor 10. Enable signal EN is also buffered and applied to the gate of p-channel pullup transistor 64 through a gate and substrate isolation circuit (transistors 54, 56, 58, 66) when the device is powered up.

When power is off, enable signal EN is floating, and the gate of n-channel transistor 10 is also floating. Since charge leaks off after a period of time, it is likely that the gate of n-channel transistor 10 is at ground when powered off. Thus n-channel transistor 10 does not conduct current from hot bus 20 to second bus 26 when powered off, regardless of the voltages on hot bus 20 and second bus 26.

P-channel pullup transistor 64 would otherwise conduct current from hot bus 20 to VBIAS when powered down. Anytime that a high voltage is on hot bus 20, a negative gate-to-source voltage develops on p-channel pullup transistor 64 if its gate were grounded. Instead, a gate and substrate isolation circuit applies the hot-bus voltage to the gate of p-channel pullup transistor 64. When hot bus 20 is at a high voltage, this same high voltage is applied to the gate of p-channel pullup transistor 64 by the gate and substrate isolation circuit. Thus p-channel pullup transistor 64 is shut off, presenting a high impedance between hot bus 20 and VBIAS.

The substrate or N-well under p-channel pullup transistor 64 must also be driven with the highest available voltage. The gate and substrate isolation circuit applies the hot-bus voltage to the N-well under p-channel pullup transistor 64. This puts the substrate and the p+ drain at the same voltage, preventing the p-n junction from being forward biased.

When the bus switch is powered up, the gate and substrate isolation circuit applies $V_{DD}$ from the internal power supply to the N-well, and applies the enable to the gate of p-channel pullup transistor 64. The gate and substrate isolation circuit can surprisingly operate without power, even when the internal power supply is grounded or floating.

Powered Operation

When power is applied, inverter 50 inverts signal EN and drives the gates of p-channel inverting transistor 56 and n-channel inverting transistor 58. Inverting transistors 56, 58 tend to invert the output of inverter 50 so that their drains, gate node GPO, tends to have the same logic state as enable signal EN when power is applied.

For example, when enable signal EN is low, bus-switch n-channel transistor 10 is turned off, and inverter 50 drives the gate of inverting transistors 56, 58 high, turning off p-channel inverting transistor 56 but turning on n-channel inverting transistor 58, which drives gate node GPO to ground. Gate node GPO is also the gate of p-channel pullup transistor 64, so transistor 64 turns on, biasing hot bus 20 to VBIAS. VBIAS can be power (Vcc) or it can be another voltage such as a terminating voltage that is separately generated by the chip, or can be an externally applied voltage.

The gate node GPO is also fed back and applied to the gate of p-channel source transistor 54, so transistor 54 turns on. Source transistor 54 connects Vcc to the N-well, node VSUB, through well tap 82, which is connected to the drain of transistor 54 and the source of transistor 56. Source transistor 54 also connects power to the source of p-channel inverting transistor 56, which forms an inverter with n-channel inverting transistor 58.

When enable signal EN is high, bus-switch transistor 10 turns on, connecting busses 20, 26. Inverter 50 drives the gates of inverting transistors 56, 58 low, turning on p-channel inverting transistor 56 but turning off n-channel inverting transistor 58. Initially gate node GPO is at ground, so both transistors 54, 56 conduct, driving gate node GPO higher toward Vcc.

However, as gate node GPO rises to within a threshold of power, Vcc–|Vtp|, source transistor 54 turns off, as does pullup transistor 64. Indeed, since pullup transistor 64 is often a weaker transistor wit long gate length, it tends to have a larger threshold (larger absolute value of Vtp) than does source transistor 54, which is often a minimum-gate-length device. The smaller threshold of the short-channel transistor is caused by the short-channel effect. Thus pullup transistor 64 tends to turn off first, before source transistor 54.

Once source transistor 54 turns off, inverting transistor 56 can pull gate node GPO only up to the voltage of the N-well, substrate node VSUB. A large well capacitance can source current to gate node GPO once source transistor 54 turns off. Depending on the relative sizes of transistors 54, 56, the substrate may drop to as low as Vcc–|Vtp|, but should not drop below that. Inverting transistor 56 then equalizes the voltages of gate node GPO and substrate node VSUB since its gate is driven fully to ground by inverter 50. If the voltage of nodes VSUB and GPO should fall below Vcc–|Vtp| due to leakage, then source transistor 54 again turns on, charging VSUB and GPO up to Vcc–|Vtp| when transistor 54 turns off again.

P-channel connecting transistor 66 remains off when power is applied, since its gate is connected to power. The substrate node VSUB is applied to the bulk terminal or wells under p-channel transistors 54, 56, 64, 66, as shown by the dashed lines. Node VSUB is actively driven by source transistor 54 when enable signal EN is low, through well tap 82 between inverting transistor 56 and source transistor 54. When enable signal EN is high, substrate node VSUB floats when it is higher than Vcc–|Vtp|.

Power-Down Operation

When the bus-switch chip is powered down, all Vcc connections are essentially grounded. P-channel connecting transistor 66 can conduct, since its gate is-connected to Vcc, which is low at power down. Transistors generally behave in a different manner once power is disconnected: the p-channel transistors conduct while the n-channel transistors do not conduct.

When power is off and hot bus 20 is at least a threshold above ground, connecting transistor 66 turns on, since its gate (ground) is lower than its source (hot-bus 20 voltage). Connecting transistor 66 then drives gate node GPO with the higher hot-bus voltage. This higher voltage on node GPO is applied to the gate of source transistor 54, keeping it off and isolating substrate (N-well) node VSUB from the Vcc power bus.

Inverting transistor 56 can also turn on, as its gate (ground from powered-off inverter 50) is also below its source (gate node GPO voltage above ground). Inverting transistor 56 drives the substrate node VSUB with the hot-bus voltage through well tap 82, which can be one or more metal straps, taps, or other conducting connections to the N-well under p-channel transistors 54, 56, 64, 66.

Even when some voltage drop occurs across conducting transistor 66 and inverting transistor 56, the gate and substrate of pullup transistor 64 should be sufficiently biased to prevent turn on or significant leakage.

Figure 4:
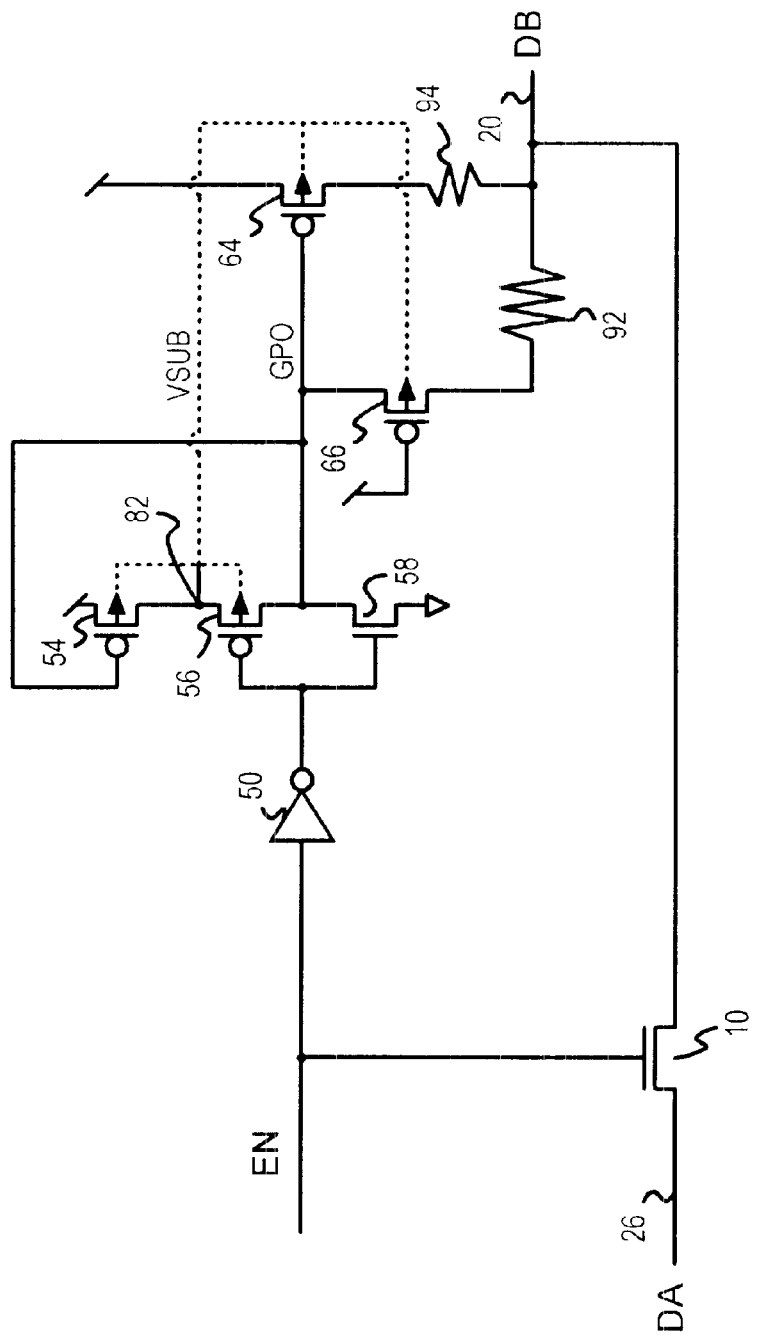
FIG. 4 shows an alternate embodiment of a bus switch with a pullup having a gate and substrate isolation circuit.

FIG. 4 shows an alternate embodiment of a bus switch with a pullup having a gate and substrate isolation circuit. Pullup resistor 94 can be added in series with p-channel pullup transistor 64. This increases the pullup resistance, providing an extra resistance to reduce the effect of variation in resistance of transistor 64. The bias voltage at the source of p-channel pullup transistor is simply Vcc in this embodiment.

An electro-static-discharge (ESD) protection circuit can be integrated with the circuit. A variety of protection devices (not shown) such as diodes, gated transistors, resistors and capacitors can be used and attached to the input pad for hot bus 20. A series resistor or a gated transistor may be placed between the input pad for hot bus 20 and the source/drain of p-channel transistor 66. ESD resistor 92 is placed in series between the pad and transistor 66 for ESD protection.

For this type of protection device, n-channel bus-switch transistor 10 can connect to the outer side of ESD resistor 92. An ESD-protection transistor (not shown) can be added to the pad. This provides increased ESD protection. Otherwise, operation of the circuit is similar to that described for FIG. 3.

ALTERNATE EMBODIMENTS

Several other embodiments are contemplated by the inventors. Other inverters can be added to the enable signal path, such as when an inverse-enable or isolation signal is available. Delay devices such as series transistors may also be added to various paths. Other p-channel transistors can have their substrates connected to node VSUB or may use another connection to Vcc. Sub-threshold conduction of the connecting transistor can also be useful to bias the substrate and gate nodes.

Additional transistors, capacitors, resistors, and other devices can be added, such as to increase delay at power-on or to provide bi-directional hot-bus sensing. The terms source and drain can be considered interchangeable and can be reversed as biases change. A second pullup transistor can be added to the second bus, and another gate and substrate isolation circuit used.

The isolation circuit for the p-channel pullup transistor could be applied to other kinds of devices besides bus switches. For example, the p-channel pullup transistor and its isolation circuit could be applied to ordinary output or I/O pads on a logic or memory chip.

The invention is also useful for live removal, w here a card is powered down and pulled out of the system. The invention has been described for live insertion of network cards, but other live insertion applications such as computer cards can benefit from the invention. Although only one bit of busses and the bus switch have been shown, many applications use a multi-bit-wide bus. The bus switch and its isolation circuit are simply replicated for each bit of the bus, although common enable signals can be used.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A bus switch comprising:

a first bus;

a second bus;

an enable signal for indicating when the first bus is to be connected to the second bus;

a bus-switch transistor for conducting current between the first and second bus in response to the enable signal;

a pullup transistor for conducting current between a bias node and the second bus in response to the enable signal, the pullup transistor having a gate node and a substrate node;

a connecting transistor coupled to conduct current from the second bus to the gate node when power is disconnected from the bus switch and the second bus is powered above ground;

a first inverting transistor coupled to conduct current from the gate node to the substrate node when power is disconnected from the bus switch and the second bus is powered above ground;

a source transistor, having a gate driven by the gate node, for conducting current from a power supply to the substrate node when power is connected, but for isolating the substrate node from the power supply when power is disconnected from the bus switch, whereby the pullup transistor is biased to isolate the second bus when power is disconnected from the bus switch and the second bus is powered above ground.

2. The bus switch of claim 1 further comprising:

an inverse-enable signal applied to a gate of the first inverting transistor, the first inverting transistor coupled to conduct current from the substrate node to the gate node in response to the inverse-enable signal when power is applied; and a second inverting transistor, having a gate driven by the inverse-enable signal and coupled to conduct current from the gate node to a ground node.

3. The bus switch of claim 2 wherein the first inverting transistor is a p-channel transistor and the second inverting transistor and the bus-switch transistor are n-channel transistors.

4. The bus switch of claim 3 further comprising:

an inverter having an input coupled to a gate of the bus-switch transistor and an output driving gates of the first and second inverting transistors with the inverse-enable signal.

5. The bus switch of claim 4 wherein the bias node is connected to the power supply or to a bias voltage generated from the power supply or to an generated bias voltage.

6. The bus switch of claim 3 wherein the pullup transistor further comprises a series resistor in series with a conducting channel of the pullup transistor.

7. The bus switch of claim 6 wherein the second bus further comprises:

an electro-static-discharge (ESD) protection resistor coupled between the transistor and the connecting transistor.

8. The bus switch of claim 2 wherein a gate of the connecting transistor is coupled to the power supply.

9. The bus switch of claim 2 wherein the pullup transistor, the connecting transistor, and the source transistor are p-channel transistors.

10. The bus switch of claim 9 wherein the substrate node includes one or more N-wells under the pullup transistor, the connecting transistor, the first inverting transistor and the source transistor.

11. A circuit comprising:

a p-channel pullup transistor having a source coupled to a first supply line, a drain coupled to a second signal line, and a gate driven by a p-gate node, and a bulk terminal coupled to a well node;

a connecting transistor having a gate driven by a power supply, a source coupled to the second signal line, and a drain coupled to the p-gate node;

a source transistor having a source coupled to the power supply, a drain coupled to the well node, and a gate coupled to the p-gate node;

a first inverting transistor having a source coupled to the well node and the source transistor, a drain driving the p-gate node, and a gate coupled to an inverse-enable input; and a second inverting transistor having a source coupled to a ground, a drain driving the p-gate node, and a gate coupled to the inverse-enable input.

12. The circuit of claim 11 wherein the first supply line is connected to the power supply or is connected to an input pad for connecting to an external bias voltage or is driven by a voltage-generating circuit.

13. The circuit of claim 11 wherein the source transistor and connecting transistor are p-channel transistors.

14. The circuit of claim 11 wherein the source transistor and connecting transistor have bulk terminals connected to the well node.

15. The circuit of claim 11 wherein the first inverting transistor is a p-channel transistor with a bulk terminal connected to the well node;

wherein the second inverting transistor is an n-channel transistor.

16. The circuit of claim 11 further comprising:

an n-channel bus-switch transistor having a source coupled to a first signal line, a drain coupled to the second signal line, and a gate driven by an n-gate node.

17. The circuit of claim 16 further comprising:

an inverter having an input coupled to the n-gate node and an output driving the inverse-enable input.

18. An isolating circuit comprising:

input means for connecting to a first signal and a second signal;

disable signal means for indicating when the first signal is to be disconnected to the second signal;

n-channel isolation transistor means for conducting current between the first and second signal in response to an n-gate;

p-channel biasing transistor means for conducting current between a fixed voltage and second signal in response to a p-gate, the p-channel biasing transistor means having an N-well;

connecting transistor means for conducting current from the second signal to the p-gate when power is disconnected from the isolating circuit and the second signal is powered above ground;

source transistor means, having a gate driven by the p-gate, for conducting current from a power supply to the N-well when power is connected, but for isolating the N-well from the power supply when power is disconnected from the isolating circuit;

p-channel inverting transistor means, coupled to the disable signal means, for conducting current from the source transistor means to the p-gate; and n-channel inverting transistor means, coupled to the disable signal means, for conducting current from the p-gate to a ground.

19. The isolating circuit of claim 18 further comprising:

inversion means, coupled to the n-gate, for driving the disable signal means as an inversion of the n-gate.

20. The isolating circuit of claim 19 further comprising:

power means for driving to a power-supply voltage a gate of the connecting transistor means when power is applied, but for grounding the gates of the connecting transistor means when power is not applied.

* * * * *